United States Patent [19]

Chhabra et al.

[11] Patent Number: 5,040,046

[45] Date of Patent: Aug. 13, 1991

[54] PROCESS FOR FORMING HIGHLY CONFORMAL DIELECTRIC COATINGS IN THE MANUFACTURE OF INTEGRATED CIRCUITS AND PRODUCT PRODUCED THEREBY

[75] Inventors: Navjot Chhabra; Eric A. Powell; Rodney D. Morgan, all of Boise, Id.

[73] Assignee: Micron Technology, Inc., Boise, Id.

[21] Appl. No.: 594,366

[22] Filed: Oct. 9, 1990

[51] Int. Cl.$^5$ .......................................... C23C 16/50
[52] U.S. Cl. ...................................... 357/54; 427/38; 427/39; 427/255.2; 427/255.3; 428/447; 437/238; 437/241
[58] Field of Search .................... 427/39, 255.2, 255.3, 427/38; 437/235, 238, 241, 243; 428/447; 357/54

[56] References Cited

U.S. PATENT DOCUMENTS 4,396,641 8/1983 Imoda et al. ........................... 427/40
4,981,724 1/1991 Hochberg et al. ............... 427/255.2

Primary Examiner—Shrive Beck
Assistant Examiner—Terry J. Owens
Attorney, Agent, or Firm—William J. Bethurum

[57] ABSTRACT

A process for forming silicon dioxide, $SiO_2$, or silicon nitride, $Si_3N_4$, layers on selected substrates which includes reacting diethylsilane, $C_4H_{12}Si$, with a selected oxygen-containing compound or nitrogen-containing compound in a plasma enhanced chemical vapor deposition (PECVD) chamber. The conformality of the coatings thus formed is in the range of 85% to 98%. The diethylsilane liquid source for the associated gas flow processing system may be maintained and operated at a source temperature as low as room temperature.

11 Claims, 1 Drawing Sheet

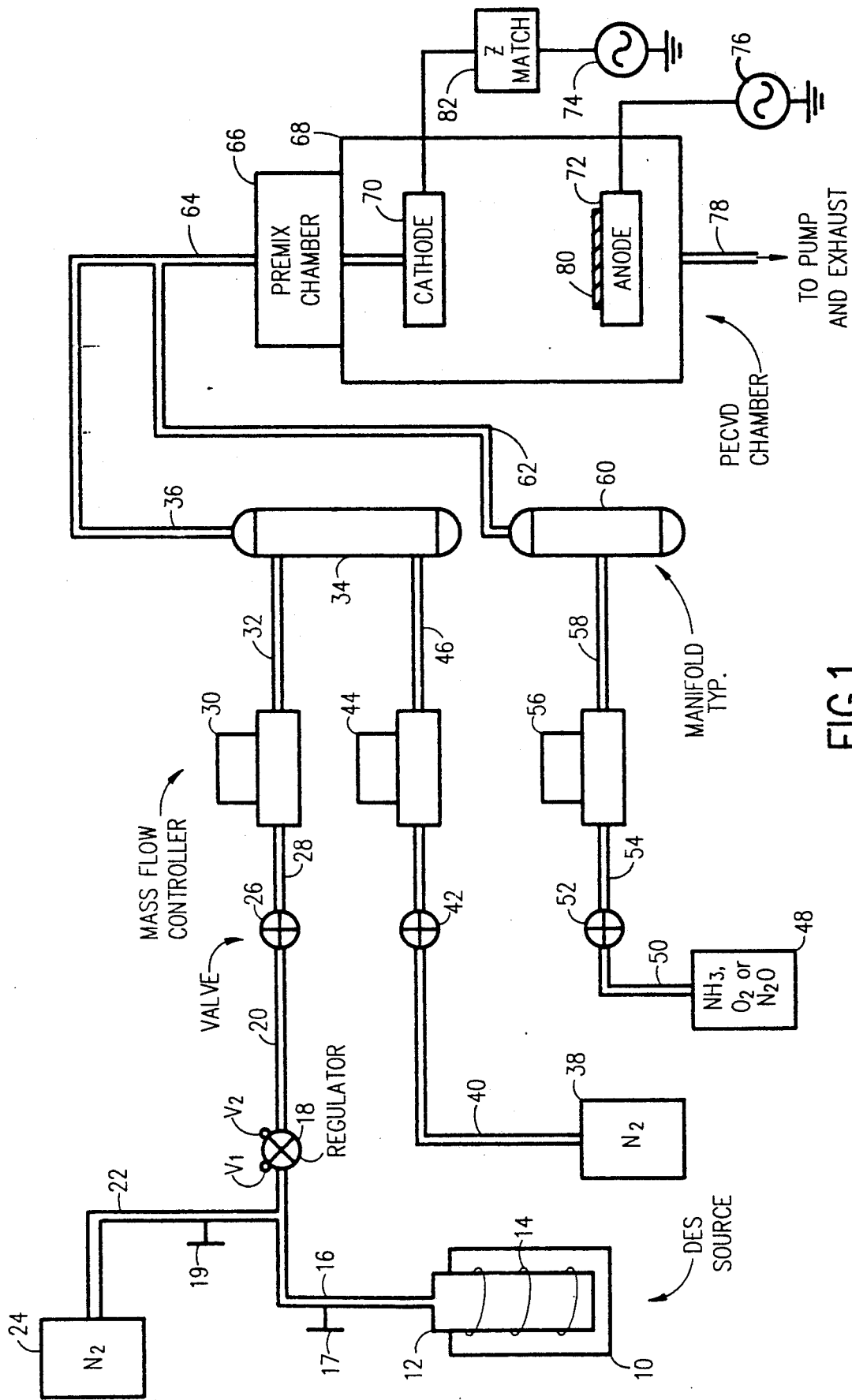

PROCESS FOR FORMING HIGHLY CONFORMAL DIELECTRIC COATINGS IN THE MANUFACTURE OF INTEGRATED CIRCUITS AND PRODUCT PRODUCED THEREBY

TECHNICAL FIELD

This invention relates generally to processes for forming multiple-use dielectric coatings in the manufacture of very large scale integrated circuits, such as dynamic random access memories (DRAMs). These coatings may be used for semiconductor surface passivation and protection, diffusion masks and barrier layers, spacers for device separation, and the like. More particularly, this invention is directed to such processes for forming highly conformal dielectric coatings of improved reliability, quality and density using relatively low temperature semiconductor wafer processing.

BACKGROUND ART

During the manufacture of various types of monolithic integrated circuits (ICs) such as high density DRAMs having several thousand transistors fabricated in a single chip of silicon, there are many stages in the multi-level layer wafer processing sequence where it is desirable to provide highly conformal coatings of a selected dielectric insulating material such as silicon dioxide, $SiO_2$, or silicon nitride, $Si_3N_4$. That is, it is desirable to deposit these insulating coatings so that they precisely replicate the geometry of the layers upon which they are formed. This feature ensures that electrical shorts through these very thin dielectric layers are prevented and it further ensures that the packing density and general reliability of the integrated circuit being fabricated are maximized.

Over the years, there have been many different types of thermal oxidation processes, vapor deposition processes and plasma deposition processes used to form oxides, nitrides, carbides, and other dielectric coatings in the manufacture of integrated circuits. Of these processes, there are two types in particular which have been used in recent years in the manufacture of high density DRAMs. The first of these processes is a low pressure chemical vapor deposition (LPCVD) process which may use, for example, tetraethylorthosilicate (TEOS) or diethylsilane (DES) as the silicon-containing reactive compound to form either oxide or nitride coatings on selected substrates. However, there are many attendant disadvantages associated with using low pressure chemical vapor deposition systems, and among these include the fact that these LPCVD systems have to be heated up to temperatures in the range of 450° to 500° C. in order to suitably generate the LPCVD chemical reaction necessary to dissociate the silicon or nitrogen containing compound and deposit the silicon dioxide or silicon nitride layer on a selected substrate.

In addition, the liquid delivery systems for the LPCVD apparatus are difficult to operate and maintain in order to produce reactant gases in the LPCVD deposition chamber, and the dielectric layer deposition rates for these LPCVD systems are difficult to control. Furthermore, these LPCVD systems are difficult to clean, and the device reliability of the semiconductor devices thus produced has not always been acceptable. For example, frequently hillocks and precipitates are produced in aluminum conductive layers over which the silicon dioxide or silicon nitride protective layers are formed.

More recently, plasma enhanced chemical vapor deposition (PECVD) systems have come to replace some of the older LPCVD systems, and generally speaking, PECVD systems have come to be more of a favored choice over LPCVD systems, even though LPCVD systems are still widely used for a variety of materials deposition processes. For approximately the past five years, silane, $SiH_4$, has been used as the silicon-containing reactive gas in these PECVD systems. However, the problem and disadvantage of using silane as a reactive gas in these PECVD systems is that it is impossible to achieve a conformality of greater than about sixty percent (60%) for the inorganic insulating layers thus formed.

To improve this conformality in the inorganic dielectric layers produced by these PECVD systems, tetraethylorthosilicate (TEOS) has been tried as a possible candidate and suitable reactant gas in PECVD systems for forming silicon-containing dielectric layers on selected substrates. However, there are several distinct disadvantages of using TEOS as the silicon containing compound in PECVD systems. For example, TEOS has a very low vapor pressure and thus must be heated up to a source temperature of greater than 50° C. to produce vapors from a TEOS source and suitable for transporting these vapors from a TEOS source and into a PECVD reaction chamber. This requirement in turn means that special mass flow controllers must be used in these TEOS systems. Additionally, the TEOS gas delivery lines as well as the mass flow controllers must be maintained at a predetermined minimum elevated temperature in order to prevent condensation in the gas flow lines and its associated damage to the chemical processing equipment which can produce significant maintenance problems. Furthermore, the use of TEOS in PECVD systems has been found to produce undesirable variations in dielectric layer deposition rates on selected substrates.

DISCLOSURE OF INVENTION

In accordance with the present invention, it has been discovered that the use of diethylsilane (DES) as the silicon containing reactant gas in a plasma enhanced chemical vapor deposition system affords the maximum number of process and device reliability advantages when compared to any other known prior art low pressure chemical vapor deposition system or to any other known plasma enhanced chemical vapor deposition system used in forming either oxides or nitrides on the surfaces of selected substrates. Among these many advantages include the ability to produce higher quality oxide and nitride layers of higher densities and at higher layer deposition rates and with a greater layer thickness uniformity than were heretofore achievable. Simultaneously, these advantages are achieved using a cleaner, lower cost, and easier-to-operate reactant gas flow system for feeding the PECVD chamber than was heretofore available.

In addition to the above very significant advantages which are afforded by practicing the present invention, the present invention provides the further advantage of being practicable at a relatively low temperature. This feature results from the fact that the vapor pressure of diethylsilane (DES) is, for example, approximately ten (10) times higher than that of tetraethylorthosilicate (TEOS). Thus, DES vapors can be driven off of the DES liquid source at almost room temperature or perhaps only slightly elevated therefrom (e.g. 35° C.) to produce highly dense and highly conformal layers of silicon dioxide and silicon nitride having a conformality typically in the range of 85 to 98%. This low temperature gas flow operation greatly minimizes maintenance and repair problems within the gas flow delivery system and enhances overall reliability of the semiconductor devices thus produced. This process has the further advantage of improving the uniformity and consistency of dielectric layer deposition rates within the PECVD chamber.

These silicon dioxide and silicon nitride layers are useful in a wide range of applications in the manufacture of many different types of integrated circuits. For example, these applications include the use of these materials as protective layers for integrated circuit conductors, protective and passivating layers for semiconductor surfaces and PN junctions formed thereon, spacers for use on word lines and bit or digit lines of random access memories, and as diffusion masks for determining the P or N-type conductivity profiles in semiconductor substrates. Furthermore, it has also been discovered that the process according to the present invention is capable of minimizing hillocks and precipitates which have heretofore occurred at the surfaces of conductive strips or layers which are covered and protected by the oxide and nitride layers thus formed. Moreover, it has further been discovered that not only can highly conformal insulating films very close to 100% conformality be formed using the present process, but the resultant stress of these insulating films can be both minimized and made variable to suit a particular device application as will be described in more detail below.

The above many advantages and attendant novel features of this invention are achieved by the provision of a plasma enhanced chemical vapor deposition process of the type described which includes the steps of:

a. providing a selected substrate between reactive electrodes within a plasma reaction chamber, b. introducing diethylsilane and a selected oxygen-containing compound or a selected nitrogen-containing compound into the plasma reaction chamber at a relatively low source temperature at or only slightly greater than room temperature, and c. creating a plasma reaction within the plasma reaction chamber and between the diethylsilane and either the selected oxygen-containing or the nitrogen-containing compound to thereby deposit either an oxide coating or a nitride coating on the surface of the substrate which is exposed to the plasma reaction. In this manner, low temperature gas flow processing results in improved reliability and operational characteristics of the gas flow PECVD processing system used as well as the semiconductor devices and integrated circuits produced thereby.

The present invention described briefly above, together with its attendant advantages and novel features, will become better understood from the following description of the accompanying drawings

BRIEF DESCRIPTION OF THE DRAWING

FIG. 1 is a schematic process flow diagram of one embodiment of this invention illustrating a gas delivery system leading into a plasma enhanced chemical vapor deposition reaction chamber and useful for effectively carrying out the novel processes claimed herein.

DETAILED DESCRIPTION OF THE PREFERRED EMBODIMENT

Referring now to FIG. 1, a source 10 of diethylsilane (DES), $C_4H_{12}Si$, is provided in a conventional bubbler chamber 12 having a heater coil 14 therein for heating the diethylsilane source 10 to a temperature of about 35° C., or only slightly higher than room temperature of typically about 25° C. Diethylsilane, $C_4H_{12}Si$, is commercially available in the preferable semiconductor grade from the Schumacker Corporation in Carlsbad, Calif. Vapors from the liquid diethylsilane source 10 pass upwardly through the adjoining gas flow line 16 to a pressure regulator 18. The pressure in the gas flow line 16 will vary slightly with the variation of DES liquid levels in the ampoule 12. The pressure regulator 18 includes an input valve V1 which is operative to maintain the input pressure to the regulator 18 at a value of about −14 inches of mercury, Hg, and an output valve V2 operates to maintain the output pressure from the regulator 18 and in the gas flow line 20 at a pressure of about −18 inches of mercury. The pressure regulator is further connected as shown by way of another gas feed line 22 to a source 24 of $N_2$ purge gas used in purging the system prior to start up and is also used to flush out the system when the ampoule 12 is being replaced with a new ampoule. Both of the gas feed lines 16 and 22 are provided with shut off valves 17 and 19, respectively, which may be used at any time to both start up and shut down the system operation.

The diethylsilane vapors passing down the gas flow line 20 enter a NUPRO type of air activated shut-off valve 26 whose output port is connected by way of the gas feed line 28 to a first mass flow controller 30. The output port of the mass flow controller 30 is in turn connected by way of an additional gas feed line 32 into a first manifold 34 wherein the diethylsilane vapors are combined and mixed with additional nitrogen gases from the $N_2$ source 38 to provide a good uniform gas mixture before exiting the output gas feed line 36.

An additional source of nitrogen gas is provided as indicated at the $N_2$ gas reservoir 38 which is connected by way of a gas feed line 40 and into a second NUPRO type of air activated shut-off valve 42. The air activated shut-off valve is in turn connected to a second mass flow controller 44 whose output gas feed line 46 is connected as a second input to the first manifold 34.

A source of either ammonia, $NH_3$, oxygen, $O_2$, or nitrous oxide, $N_2O$, as indicated at the gas reservoir 48 is connected by way of its output gas feed line 50 to a third NUPRO type of air activated shut-off valve 52. The NUPRO valve 52 is in turn connected by way of its output gas feed line 54 to a third mass flow controller 56 which serves to control the gas flow rate of either ammonia, oxygen or nitrous oxide by way of output feed line 56 into a second manifold 58. All of the above identified mass flow controllers 30, 44, and 56 are preferably of the electronic type wherein a variable set point may be established to provide a constant chosen gas flow rate and to automatically compensate for external parameter variations, such as variations in temperature and variations in pressures in the various feed lines of the system. The manifolds 34 and 60 which are fed by the above identified mass flow controllers are used simply to provide good premixing of the various combined gases, and the hydrides in the gas feed line 36 are separated from the oxygen containing compounds and ammonia, $NH_3$, until passing through the feed line 64 and into the premixing chamber 66. This is done primarily as a safety precaution as is known for these types of PECVD gas flow systems.

The particular selected reactant gas (NH$_3$, O$_2$ or N$_2$O) indicated at source 48 is then passed through an output gas feed line 62 exiting from the second manifold 60 and is then combined in the common gas feed line 64 with the diethylsilane and nitrogen vapors received from the gas feed line 36. This gaseous mixture is then fed by way of the common gas feed line 64 into a premixing chamber 66 positioned directly adjacent to the plasma enhanced chemical vapor deposition chamber 68.

The PECVD chamber 68 includes a cathode electrode 70 and an anode electrode 72 spaced apart therein, with each electrode connected to a separate RF voltage source 74 and 76 as shown. One suitable PECVD reaction chamber 68 useful in carrying out the above described process is available from the Novellus Corporation of San Jose, Calif. and sold under the trade name CONCEPT I. This type of PECVD plasma reaction chamber will also typically include a pump and exhaust feed line 78 which is connected to the PECVD chamber 68 to provide the necessary pumping to establish the necessary partial vacuum conditions therein during PECVD operation and to provide the necessary gas exhaust line 78 therefor used to flush out the system after a wafer processing operation has been completed.

In the normal operation, a silicon wafer 80 will be disposed on the upper surface of the anode electrode 72 as shown, and may have been processed to various stages toward completion of the ultimate or complete integrated circuit being fabricated. For example, the wafer 80 may have been processed to the stage where conductive interconnect strips have been photodefined and disposed and interconnected on the wafer surface and are now ready to receive a protective inorganic dielectric coating of either SiO$_2$ or Si$_3$N$_4$, or both, thereon in accordance with the examples given below.

As previously indicated, the power ratios received from the high frequency RF source 74 and from the low frequency RF source 76 may be varied in order to vary the stress of the deposited dielectric layer from a highly tensile state to a highly compressive state. The high frequency RF source is typically operated at 13.56 megahertz and the low frequency RF source is typically operated between 100-400 kilohertz. The high frequency RF source is connected as shown through an anti-reflection impedance matching network 82 which prevents high frequency RF power from being reflected back into the RF source 74. Such an impedance matching network is not required for the low frequency RF source 76. As an example, the total RF power applied to the PECVD chamber may be 2200 watts, with 800 watts being applied from the high frequency RF source 74 and 400 watts being applied from the low frequency RF source 76. As a general rule and making certain other conventional assumptions and assuming certain constant values for the particular layers and other components of the wafer 80 at a particular stage in its processing sequence, an increase in high frequency power and a corresponding decrease in low frequency power will increase the compressive stresses in the deposited layers in dynes per centimeter squared. Conversely, a reversal of these low frequency to high frequency power ratios will serve to increase the tensile forces in the deposited layers.

Accordingly, the use of diethylsilane in combination with a plasma enhanced chemical vapor deposition reaction of the type illustrated in FIG. 1 and further in combination with either a nitrogen-containing or oxygen-containing gas source is capable of producing, respectively, very dense, uniform and consistent layers of either silicon nitride or silicon dioxide on a silicon substrate 80 at very uniform layer deposition rates. In addition, this novel system and deposition process provides many advantages as previously described relative to any other known low pressure chemical vapor deposition (LPCVD) process or plasma enhanced chemical vapor deposition (PECVD) process used for forming these same dielectric layers on silicon substrates.

The following Example 1 provides processing parameters useful in accordance with the present invention for forming silicon dioxide coatings using oxygen as the oxygen-containing gas. Example 2 below provides processing parameters for forming silicon dioxide, SiO$_2$, coatings using nitrous oxide, N$_2$O, as the oxygen containing gas. Example 3 below provides the necessary process parameters for forming a dielectric layer of silicon nitride, Si$_3$N$_4$, on a silicon substrate using ammonia, NH$_3$, as the nitrogen containing gaseous compound.

EXAMPLE 1

Diethylsilane, C$_4$H$_{12}$Si, was heated in the bubbler ampoule 12 to a temperature of about 35° C. and then passed through the gas feed line 20 at a pressure of approximately 20 inches of mercury and then through the mass flow controller 30 at a gas flow rate of 240 standard cubic centimeters per minute (sccm) into the first manifold 34. Oxygen was passed from the gas source 48 and at a pressure of approximately 35 psi in the gas feed line 54 and then through the mass flow controller 56 at a gas flow rate of about 8 liters per minute. The nitrogen source 38 was not used for this SiO$_2$ deposition run. The PECVD chamber 68 was pumped down to a pressure of about 1.8 Torr and heated to about 350° C. The high frequency RF power in the PECVD chamber 68 was set to 600 watts and the low frequency RF power therein was set to 600 watts during the deposition of approximately 6560 angstroms of silicon dioxide on a silicon substrate 80 which was disposed as shown on the anode 72. This SiO$_2$ deposition was carried out in a time of approximately seventy (70) seconds and in accordance with the following expression:

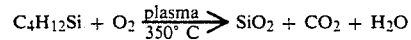

$$C_4H_{12}Si + O_2 \xrightarrow[350°\text{C}]{\text{plasma}} SiO_2 + CO_2 + H_2O$$

EXAMPLE 2

Diethylsilane, C$_4$H$_{12}$Si, was heated in the bubbler 12 to a temperature of about 35° C. and passed through the gas feed line 20 at approximately −20 inches of mercury and through the mass flow controller 30 at 240 standard cubic centimeters per minute (sccm) into the first manifold 34. Nitrous oxide, N$_2$O, was passed from the source 48 at a pressure of 35 psi in the gas feed line 54 and then through the mass flow controller 56 at a gas flow rate of between 7 and 8 liters per minute and then into the second manifold 60. The DES vapors exiting the first manifold 34 by way of gas feed line 36 were then mixed with the N$_2$O vapors received from the second manifold 60 in the common gas feed line 64 leading into the premixing chamber 66. The nitrogen source 38 again was not used in this SiO₂ deposition run. The PECVD chamber 68 was pumped down to a pressure of about 1.9 Torr and heated to an elevated temperature of about 350° C. The high frequency RF power for the PECVD chamber 68 was set to 500 watts and the low frequency RF power therein was set to 800 watts during the deposition of 5700 angstroms of SiO₂ on a silicon substrate 80 disposed on the anode 72. This deposition was carried out in a time of about seventy (70) seconds in accordance with the following expression:

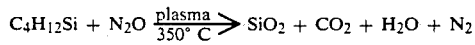

EXAMPLE 3

Diethylsilane, C₄H₁₂Si was heated to a temperature of about 35° C. in the bubbler 12 and passed through the gas feed line 20 at approximately −20 inches of mercury and then through the mass flow controller 30 at 150 standard cubic centimeters per minute (sccm) into the first manifold 34. Ammonia, NH₃, was passed from the gas source 48 and through the mass flow controller 56 at a gas flow rate of about 2 liters per minute into the second manifold 60. In addition, and in order to improve the uniformity of the silicon nitride film being deposited, nitrogen was passed from the auxiliary N₂ source 38, through the mass flow controller 44 and through the gas feed line 46 at a gas flow rate of approximately 2 liters per minute into the first manifold 34 where the nitrogen was mixed with the diethylsilane received from the gas feed line 32. The PECVD chamber 68 was pumped down to a pressure of about 3.0 Torr and heated to about 400° C. before applying a high frequency RF power of 500 watts and a low frequency RF power of 800 watts to the cathode 70 and anode 72, respectively, in the PECVD chamber 68 as previously described. During this process deposition, approximately 4200 angstroms of silicon nitride were deposited on a silicon substrate 80 disposed on the PECVD anode 72 in a time of about 175 seconds. This silicon nitride deposition was carried out in accordance with the following expression:

Various modifications may be made in and to the above described embodiments without departing from the spirit and scope of this invention. For example, the present invention is limited neither by the specific gas flow processing system illustrated in FIG. 1 herein nor by the specific processing parameters given in the above examples. Accordingly, obvious process flow system design and process modifications used therein may be made to the above described inorganic layer deposition processes and examples of dielectric layers formed without departing from the scope of the present invention.

It is also within the scope of the present invention and the claims appended hereto to deposit materials other than those specifically described above, such as epitaxial silicon, silicon carbide and silicon oxy-nitride, $Si_xO_yN_z$, phosphorus silicate glass (PSG) and borophosphorus silicate glass (BSG) using diethylsilane and by modifying the reactant gas sources in FIG. 1 in a controlled manner by those skilled in the art. In addition, for all of the above described processes, it is possible to operate the DES source 10 at room temperature or 25° C. and thereby eliminate the heating element 14 as previously described. That is, the various vapor and gas delivery lines described above and located between the DES source 10 and the PECVD chamber are relatively short, so that it is possible to obtain an adequate vapor flow rate in the delivery lines of this system at room temperature.

It is further possible to operate the PECVD chamber 68 in all of the above examples within a wide temperature range of between 325° C. and 450° C. as a matter of choice and depending upon whether higher temperatures in the range of 400° C. or greater would be unduly degrading to the semiconductor structures being processed. Accordingly, these and other process and materials variations are clearly within the scope of the following appended claims.

We claim:

1. A process for forming inorganic dielectric layers on semiconductor substrates which comprises exposing said substrates to a plasma reaction of diethylsilane, C₄H₁₂Si, and a reactive element-containing compound at a predetermined temperature to deposit said dielectric layers which contain said reactive element on the exposed surfaces of said semiconductor substrates.

2. The process defined in claim 1 wherein said semiconductor substrates are silicon and said reactive element-containing compound is selected from the group consisting of oxygen, O₂, nitrous oxide, N₂O, and ammonia, NH₃, whereby inorganic dielectric layers of silicon dioxide, SiO₂, or silicon nitride, Si₃N₄, are deposited on said silicon substrates with a conformality of 85% or greater.

3. The process defined in claim 2 wherein said predetermined temperature is in the range of 325° C. through 450° C.

4. The process defined in claim 3 wherein said diethylsilane, C₁₂H₄Si, is maintained at a source temperature in the range of 25° C. through 35° C.

5. A process for depositing silicon dioxide or silicon nitride insulating layers on semiconductor substrates which comprises the steps of:
   a. inserting a semiconductor substrate between reaction electrodes within a plasma reaction chamber,
   b. introducing diethylsilane, C₄H₁₂Si, and either a selected oxygen-containing or nitrogen-containing compound into said plasma reaction chamber while maintaining said diethylsilane at a source temperature between room temperature of about 25° C. and a temperature of about 35° C., and
   c. creating a plasma reaction between said diethylsilane and said oxygen-containing or nitrogen-containing compound to thereby deposit either an oxide coating or a nitride coating on a surface of said semiconductor substrate which is exposed to said plasma reaction.

6. The process defined in claim 5 wherein said nitrogen containing compound is ammonia, NH₃, and said oxygen containing compound is selected from the group consisting of oxygen, O₂, and nitrous oxide, N₂O.

7. The process defined in claim 6 wherein the temperature at the source of said diethylsilane is maintained at a level in the range of between about 25° C. to about 35° C.

8. The process defined in claim 6 wherein diethylsilane, $C_4H_{12}Si$, and oxygen, $O_2$, are reacted in said plasma reaction chamber at a predetermined temperature to form silicone dioxide, $SiO_2$, carbon dioxide $CO_2$, and water, $H_2O$.

9. The process defined in claim 6 wherein diethylsilane and $N_2O$ are reacted in a plasma reaction chamber at a predetermined temperature to form $SiO_2$ and $CO_2$ and $H_2O$ and $N_2$.

10. The process defined in claim 6 wherein diethylsilane and $NH_3$ are reacted in said plasma reaction chamber at a predetermined temperature to form $Si_3N_4$ and carbon compounds.

11. An integrated circuit having highly conformal layers of either silicon dioxide, $SiO_2$, or silicon nitride, $Si_3N_4$, formed on the surface of a silicon substrate, said conformal layers being formed to a conformality in the range of 85%–98% by the process of:
  a. inserting a silicon substrate between reaction electrodes within a plasma reaction chamber,
  b. introducing diethylsilane and either a selected oxygen-containing or nitrogen-containing compound into said plasma reaction chamber, said nitrogen containing compound being ammonia, $NH_3$, and said oxygen containing compound being selected from the group consisting of oxygen, $O_2$, and nitrous oxide, $N_2O$, and
  c. creating a plasma reaction between said diethylsilane and said selected oxygen-containing or nitrogen-containing compound at a predetermined temperature to thereby deposit either an oxide coating or a nitride coating on a surface of said silicon substrate which is exposed to said plasma reaction.

* * * * *